US005557843A

United States Patent [19]

McKenney et al.

[11] Patent Number: 5,557,843
[45] Date of Patent: Sep. 24, 1996

[54] METHOD OF MAKING A CIRCUIT BOARD OR LAYER THEREOF INCLUDING SEMI-CURING A SECOND ADHESIVE COATED ON A CURED FIRST ADHESIVE

[75] Inventors: Darryl J. McKenney, Milford; Robert D. Cyr, Manchester, both of N.H.

[73] Assignee: Parlex Corporation, Methuen, Mass.

[21] Appl. No.: 297,792

[22] Filed: Aug. 30, 1994

Related U.S. Application Data

[62] Division of Ser. No. 110,437, Aug. 23, 1993, Pat. No. 5,362,534.

[51] Int. Cl.[6] .............................. H05K 3/28; H05K 3/38; H05K 3/46
[52] U.S. Cl. .............................. 29/851; 29/830; 174/259
[58] Field of Search ...................... 29/830, 831, 846, 29/851, DIG. 1; 156/629.1, 630.1, 632.1; 174/258, 259; 361/750; 427/96

[56] References Cited

U.S. PATENT DOCUMENTS

| | | | |
|---|---|---|---|
| 2,923,651 | 2/1960 | Petriello | 29/851 X |
| 3,795,047 | 3/1974 | Abolofia et al. | 29/830 X |
| 3,936,575 | 2/1976 | Watanabe et al. | 428/417 |
| 3,962,520 | 6/1976 | Watanabe et al. | 428/414 |
| 4,215,387 | 7/1980 | Negishi | 361/398 |
| 4,311,749 | 1/1982 | Hiraiwa et al. | 428/209 |
| 4,338,149 | 7/1982 | Quascher | 156/248 |
| 4,556,628 | 12/1985 | Grescher et al. | 430/314 |
| 4,582,564 | 4/1986 | Shanfield et al. | 156/643 |
| 4,671,968 | 6/1987 | Slominski | 427/12 |
| 4,774,122 | 9/1988 | Adler | 428/156 |
| 4,775,444 | 10/1988 | Cordani | 156/634 |
| 4,781,969 | 11/1988 | Kobayashi et al. | 428/209 |
| 4,783,247 | 11/1988 | Seibel | 204/181.1 |
| 4,800,461 | 1/1989 | Dixon et al. | 361/398 |
| 4,897,118 | 1/1990 | Ferrier | 106/1.11 |
| 4,897,165 | 1/1990 | Bernards et al. | 204/24 |
| 4,915,797 | 4/1990 | Vigezzi et al. | 204/28 |
| 4,932,518 | 6/1990 | Bernards et al. | 204/52.1 |
| 4,958,050 | 9/1990 | Oku et al. | 174/261 |
| 4,964,945 | 10/1990 | Calhoun | 156/632 |
| 4,969,979 | 11/1990 | Appelt et al. | 204/15 |
| 5,004,525 | 4/1991 | Bernards et al. | 204/52.1 |
| 5,004,639 | 4/1991 | Desai | 428/138 |
| 5,068,013 | 11/1991 | Bernards et al. | 204/24 |
| 5,072,074 | 12/1991 | DeMaso et al. | 174/254 |
| 5,084,124 | 1/1992 | Taniguchi | 156/315 |
| 5,095,628 | 3/1992 | McKenney et al. | 29/846 |
| 5,097,390 | 3/1992 | Gerrie et al. | 361/412 |
| 5,100,492 | 3/1992 | Kober et al. | 156/250 |
| 5,112,694 | 5/1992 | Konotsune et al. | 428/457 |
| 5,121,297 | 6/1992 | Haas | 361/398 |
| 5,129,142 | 7/1992 | Bindra et al. | 29/830 X |
| 5,142,448 | 8/1992 | Kober et al. | 361/398 |
| 5,144,534 | 9/1992 | Kober | 361/398 |
| 5,144,742 | 9/1992 | Lucas et al. | 29/830 |
| 5,147,208 | 9/1992 | Bachler | 439/67 |
| 5,153,987 | 10/1992 | Takahashi et al. | 29/852 |
| 5,162,140 | 11/1992 | Taniguchi | 428/40 |
| 5,172,472 | 12/1992 | Linder et al. | 29/845 |
| 5,173,150 | 12/1992 | Kanaoka et al. | 156/630 |
| 5,175,047 | 12/1992 | McKenney et al. | 428/209 |
| 5,178,318 | 1/1993 | Edwin et al. | 228/180.2 |
| 5,206,463 | 4/1993 | DeMaso et al. | 428/901 |
| 5,213,840 | 5/1993 | Retallick et al. | 427/97 |
| 5,214,571 | 5/1993 | Dahlgren et al. | 361/414 |
| 5,344,893 | 9/1994 | Asai et al. | 525/398 |

FOREIGN PATENT DOCUMENTS

| | | | |
|---|---|---|---|
| 305594 | 12/1988 | Japan | 29/830 |
| 218616 | 8/1993 | Japan | 29/830 |
| 2111313 | 6/1983 | United Kingdom | 29/830 |

*Primary Examiner*—Peter Vo
*Attorney, Agent, or Firm*—Weingarten, Schurgin, Gagnebin & Hayes

[57] ABSTRACT

A printed circuit board and method of manufacture thereof is disclosed. The printed circuit board includes a first substrate provided from a conductive layer having disposed on a first surface thereof a cured adhesive layer, A semi-cured adhesive layer is then disposed over the cured adhesive layer and a second substrate is disposed against the semi-cured adhesive layer.

6 Claims, 3 Drawing Sheets

METHOD OF MAKING A CIRCUIT BOARD OR LAYER THEREOF INCLUDING SEMI-CURING A SECOND ADHESIVE COATED ON A CURED FIRST ADHESIVE

This application is a division of application Ser. No. 08/110,437, filed Aug. 23, 1993, now U.S. Pat. No. 5,362,534.

FIELD OF THE INVENTION

This invention relates to printed circuit boards and more particularly to flexible printed circuit boards.

BACKGROUND OF THE INVENTION

As is known in the art, flexible printed circuit boards typically are manufactured using substrates provided from woven materials such as pre-impregnated glass materials for example. This is especially true in the case of a so-called rigid-flex printed circuit board. Several of such substrates are typically bonded together by the inclusion of adhesive layers between the substrates. Such flexible printed circuit boards made from woven materials and conventional adhesives typically lack a homogeneous dielectric constant between adjacent inner layers.

As is also known, conventional manufacturing techniques provide printed circuit boards having an uneven surface topography. That is, the topography of a surface of the printed circuit board may vary, for example, between 0.010 inches and 0.020 inches. Such an uneven surface topography makes it relatively difficult to stack and drill several of such boards since the boards cannot be stacked flat during a drilling process. If the boards are not flat when stacked during drilling, then excessive burring occurs thus ruining the printed circuit boards.

Prior art approaches have typically used embossing materials to force the adhesive material to fill and flow around conductors on the substrate. Thus, the surface of the substrate had an uneven topography which did not allow the substrates to be stacked flatly.

When substrates are not placed in a flat stack, it is relatively difficult to drill through the substrate since this would result in fracturing of the substrate through the back layer due to the uneven surface topography of the substrate. That is, the uneven surface topography results in the lack of proper support for each layer. This results in excessive burring of the printed circuit board when a drilling operation is performed on a stack of substrates. Thus, it is relatively difficult to drill through more than one substrate at a time. Therefore, prior art approaches typically drill holes through only one substrate at a time since the substrates are provided having uneven surface topographies.

Thus, flexible printed circuit boards are relatively expensive to manufacture because drilling and routing operations, for example, must be performed on one substrate at a time.

It would be desirable therefore to provide a printed circuit board having flat surfaces since this facilitates stacking and drilling of multiple printed circuit boards.

SUMMARY OF THE INVENTION

In accordance with the present invention, a printed circuit board includes a first substrate provided from a conductive layer having disposed on a first surface thereof a cured adhesive layer. A semi-cured adhesive layer is then disposed over the cured adhesive layer and a second substrate is disposed against the semi-cured adhesive layer. With this particular arrangement, a printed circuit board having substantially homogeneous layers is provided. The printed circuit board may be provided for example as a so-called Type 3 multilayer flexible circuit having three or more layers. The cured adhesive and semi-cured adhesive provide a combined adhesive and dielectric material which may be used to control lamination thickness and surface topography. The printed circuit board may alternatively be provided as a so-called Type 4 rigid-flex printed circuit board using only non-woven materials. That is, the rigid-flex printed circuit board may be provided without the use of glass reinforced fabric or any other woven material in either the rigid or flexible sections. By coating the conductive layer with adhesive and fully curing the adhesive and using a semi-cured flowable stage the size of gaps around conductive lines disposed against the semi-cured stage is minimized and the flatness of the boards for stacking and drilling is optimized. That is, the semi-cured stage reduces tolerance stack ups in the printed circuit board. Thus, this arrangement provides a homogeneous adhesive and dielectric which have equal coefficients of thermal expansion and which bind the layers together. This arrangement also provides a flexible printed circuit board assembly which is flat. That is, the surface topography of the printed circuit board is substantially level across a surface of the printed circuit board. By providing a flat printed circuit board several of such boards may be stacked and simultaneously drilled or otherwise machined for example. Thus the printed circuit board may be provided as a relatively inexpensive printed circuit board. That is, this technique allows multiple layer flexible and rigid-flex printed circuit boards to be manufactured relatively inexpensively using conventional, low cost manufacturing techniques. The present invention provides a printed circuit board having an even surface topography and thus allows a user to simultaneously drill a plurality (e.g. 2–12) of substrates. When combined with multiple drill bits on a drilling machine the present invention allows, for example, 48 printed circuit board to be simultaneously processed where a conventional approach only would be able to simultaneously process 4 boards for example.

In accordance with a further aspect of the present invention, a flexible printed circuit board includes an inner layer having first and second opposing surfaces. A pair of coated conductive foil layers are respectively disposed over the first and second surfaces of the inner layer. With this particular arrangement, a flexible printed circuit board having three or more layers may be provided having homogeneous layers and having an even surface topography. Furthermore, the flexible printed circuit board may be used in a mass lamination process. The inner layer be provided from epoxy type materials as is generally known having a polyimide adhesiveless center layer. The surfaces of the inner layer may or may not have a conductive plating disposed thereon. That is, the inner layer may be provided having unplated surfaces or alternatively one or both inner layer surfaces may have a conductive plating disposed thereon. The coated conductive foil layers each include a conductive foil which may be provided, for example, from a coated roll of electrodeposited or rolled annealed copper or other conductive metal. The conductive foil is provided having an adhesive coated on a first surface thereof. The adhesive is cured and then a second adhesive is disposed over the cured adhesive. The second adhesive is then semi-cured. The first and second adhesives operate as a combined adhesive and dielectric material. Thus, each of the coated conductive foil layers includes a conductive foil having a combined adhesive and dielectric disposed thereon. The conductive foil layers may then be simultaneously applied to the first and second opposing surfaces of the inner layer. The combined adhesive and dielectric material controls the dielectric thickness between the conductive foils and also controls the surface topography. Thus, the surface topography of the printed circuit board is suitable for machine processes and other post bonding processes. The printed circuit board is thus provided as a homogenous epoxy or polyimide adhesive system that maintains its modules of flexibility after curing. Also by curing the first and second adhesive coatings separately, the dielectric distance between layers may be controlled. By providing the adhesive layers from a homogenous dielectric and bonding resin a printed circuit board having a homogeneous dielectric constant and coefficient of thermal expansion may be provided. Furthermore, by providing the second adhesive layer with a high flow resin displacement characteristic, the areas around conductors disposed on the inner layers may be effectively filled. Moreover because the dielectric distance between layers may be controlled, the printed circuit board may be provided having a smooth surface. Thus, because of the even surface topography, a plurality of such boards may be stacked and simultaneously drilled or process through other machining processes. Also by providing the cured and uncured adhesive layers it is possible to effectively control line impedance characteristics based on the pre-cured desired thickness. The current tolerance of electrical impedance variation is reduced by over fifty percent. That is, when conventional manufacturing methods are used, line impedances have tolerances typically of about ±10 percent the desired impedance. With the present invention, however, line impedances may be provided having a tolerance typically of about ±5 percent. Thus, a flexible printed circuit board having three or more layers may be provided having an even surface topography and having signal paths with desired impedance characteristics. By providing the printed circuit boards with an even surface topology, a plurality of such flexible printed circuit boards may be arranged in a stack and passed through a machine process such as a drilling process for example.

In accordance with a still further aspect of the present invention, a rigid-flex printed circuit board includes a rigid portion and a flex portion and includes an inner layer having first and second opposing surfaces which may or may not have a conductive plating disposed thereon. That is, the inner layer may be provided having unplated surfaces or alternatively one or both inner layer surfaces may have a conductive plating disposed thereon. The inner layer is disposed between a pair of coated conductive foil layers. Each of the conductive foil layers are provided having disposed on a first surface thereof a cured adhesive layer. A semi-cured adhesive layer is then disposed over the cured adhesive layer and a second substrate is disposed against the semi-cured adhesive layer. With this particular arrangement a rigid-flex printed circuit board having no woven materials may be provided. The rigid-flex printed circuit board may be provided from a combination of resins and nonwoven materials that eliminate the utilization of glass fabric and other woven materials as a coating medium as well as an insulator. This allows the rigid-flex printed circuit board to thermally dissipate heat in a linear direction instead of the traditional machine and transverse directions associated with conventional 104 to 7628 glass fabric which has been coated into a so-called prepreg material. The printed circuit board of the present invention thus provides more uniform thermal stability and thus is provided having a reduced number of defects due to measeling. Also by eliminating the use of glass fabric and other woven materials, the printed circuit board may be provided as a relatively thin printed circuit board. This construction technology also allows non-woven, thermally stable materials such as aramid thin core inner layers to be used. Such layers may be coated with substantially the same resin system to create a homogenous construction. Thus, a rigid-flex printed circuit board having three or more layers may be provided having an even surface topography. By providing the printed circuit boards with an even surface topology, a plurality of such flexible printed circuit boards may be arranged in a stack and machined in a machine process such as a drilling process for example. The coated conductive foil layers each include a conductive foil which may be provided, for example, from a coated roll of electrodeposited or rolled annealed copper or other conductive metal. The conductive foil is provided having an adhesive coated on a first surface thereof. The adhesive is cured and then a second adhesive is disposed over the cured adhesive. The second adhesive is then semi-cured. The first and second adhesives operate as a combine to adhesive and dielectric material. Thus, each of the coated conductive foil layer includes a conductive foil having a combined adhesive and dielectric disposed thereon. The conductive foil layers may then be simultaneously applied to the first and second opposing surfaces of the inner layer. The combined adhesive and dielectric material controls the dielectric thickness between the conductive foils and also controls the surface topography. Thus, the surface topography of the printed circuit board is suitable for machine processes and other post bonding processes. The printed circuit board is thus provided from a homogenous epoxy or polyimide adhesive system that maintains its modules of flexibility after curing. Also by curing the first and second adhesive coatings separately, the dielectric distance between layers may be controlled. By providing the adhesive layers from a homogenous dielectric and bonding resin a printed circuit board having a homogeneous dielectric constant and coefficient of thermal expansion may be provided. Furthermore, by providing the second adhesive layer with a high flow resin displacement characteristic, the areas around conductors disposed on the inner layers may be effectively filled. Moreover because the dielectric distance between layers may be controlled, the printed circuit board may be provided having a smooth surface. Thus, because of the even surface topography, a plurality of such boards may be stacked and simultaneously drilled or processed through other machining operations. Also by providing the cured and uncured adhesive layers it is possible to effectively control line impedance characteristics based on the pre-cured desired thickness. The current tolerance of electrical impedance variation is reduced by over fifty percent.

In accordance with a still further aspect of the present invention, a method of manufacturing a printed circuit board includes the steps of coating a first surface of a conductive foil with a first adhesive, curing the first adhesive on the first surface of the conductive foil and coating a first surface of the cured adhesive with a second adhesive, wherein the second adhesive is semi-cured. With this particular technique a low cost flexible or rigid-flex printed circuit board may be provided from all nonwoven materials. The conductive foil having the cured and uncured coatings disposed thereon provides a coated conductive foil layer. The conductive foil may be provided, for example, from a coated roll of electrodeposited or rolled annealed copper or other conductive metal. The first and second adhesives operate as a combine to adhesive and dielectric material. Thus, the coated conductive foil layer includes a conductive foil having a combined adhesive and dielectric disposed thereon. A plurality of such conductive foil layers may then simultaneously applied to first and second opposing surfaces of an inner layer. By curing the first and second adhesive coatings separately, the dielectric distance between layers may be controlled. By providing the adhesive layers from a homogenous dielectric and bonding resin, the printed circuit board may be provided having a homogeneous dielectric constant and coefficient of thermal expansion. Furthermore, by providing the second adhesive layer with a high flow resin displacement characteristic, the areas around conductors disposed on the inner layers may be effectively filled. Moreover because the dielectric distance between layers may be controlled, the printed circuit board may be provided having a smooth surface. Thus, because of the even surface topography, a plurality of such printed circuit boards may be stacked and simultaneously drilled or processed through other machining operations. Also by providing the cured and uncured adhesive layers it is possible to effectively control line impedance characteristics based on the pre-cured desired thickness.

BRIEF DESCRIPTION OF THE DRAWINGS

The foregoing features of this invention as well as the invention itself may be more fully understood from the following detailed description of the drawings in which.

DESCRIPTION OF THE PREFERRED EMBODIMENTS

Figure 1:
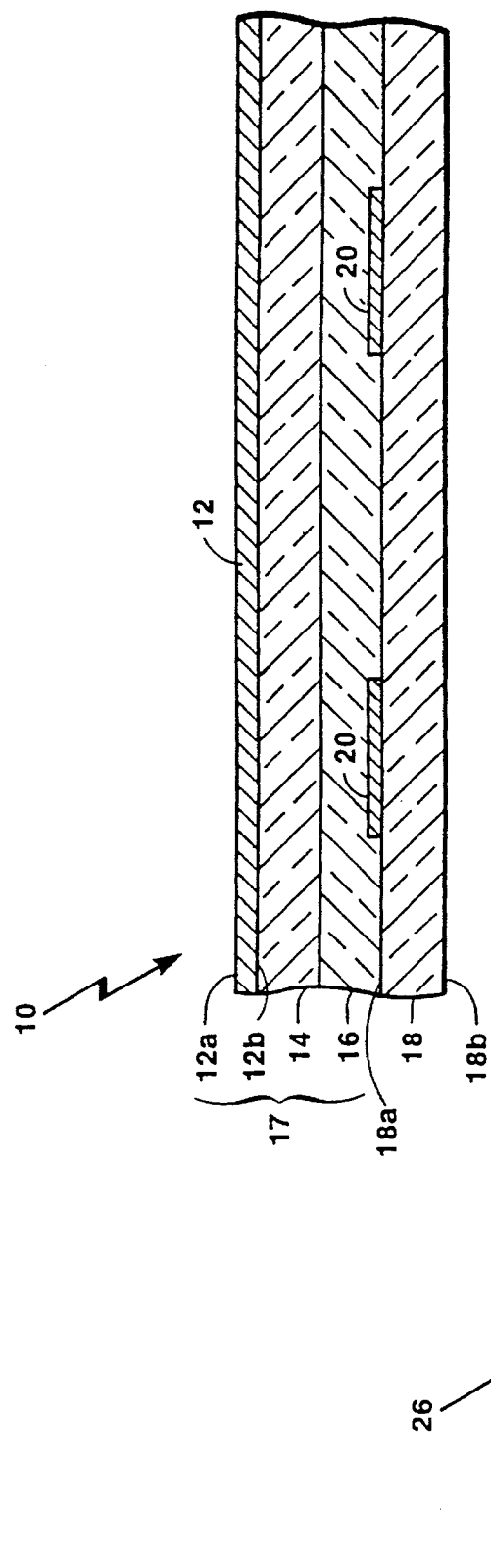
FIG. 1 is a cross-sectional view of a printed circuit board.

Referring now to FIG. 1, a printed circuit board 10 includes a conductive foil 12 having first and second opposing surfaces 12a, 12b. The conductive foil 12 may be provided, for example, as a sheet of copper foil having a width of 25 or 38 inches. Those of skill in the art will recognize of course that any type conductive foil having any width may be used. The particular type, width and thickness of the foil 12 may be selected according to a number of factors including but not limited to the size and characteristics which results in efficient use of the foil, the width and thickness which results in the lowest manufacturing cost, etc.

A first layer 14 of an adhesive resin is disposed on at least a first portion of foil surface 12b. This first resin layer 14 is then cured using curing towers in a conventional curing process as is well known to those of ordinary skill in the art. After the first resin layer 14 is cured a second layer 16 of the resin is applied over the cured resin layer 14. This second resin layer 16 is then semi-cured using curing techniques well known to those of ordinary skill in the art. The combination of the conductive foil 12, cured adhesive 14 and semi-cured adhesive 16 provide a coated conductive foil layer 17.

The first and second resin layers 14, 16 may be applied using standard coating techniques. For example, the resin may be applied to the foil through a coating head and then passed through a so-called drying tower. The drying tower may be provided as an infrared curing tower, a thermal air turbine tower, or any other type of drying apparatus well known to those of ordinary skill in the art.

The first resin layer may be disposed having a thickness typically of about 0.001 inch and may be cured at a temperature typically of about 300 degrees Fahrenheit. The semi-cured resin may be may be disposed having a thickness typically of about 0.00125 inches and may be cured at a temperature of about 200 degrees Fahrenheit. Other thicknesses and temperatures may of course be used.

For example, the resin layers may be provided having thicknesses typically in the range of about 0.0005 inch to 0.003 inch and the resins may be cured at temperatures typically in the range of about 100 degrees Fahrenheit to 450 degrees Fahrenheit. The particular combination of resin thicknesses, curing times and curing temperatures may be selected according to a variety of factors including but not limited to the particular drying apparatus used, the particular type of resin used and the particular application. Those of ordinary skill in the art will know how to select the particular curing times and temperatures required to provide the first and second resin layers.

The coated conductive foil layer 17 is then disposed over a first surface 18a of a second substrate 18. Here, the first surface of the second substrate 18 has a plurality of conductors 20 disposed thereon. The conductors 20 may be etched on the substrate 18, for example, to provide signal paths. Thus, after the inner layer substrate 18 is imaged and etched, the semi-cured resin layer 16 is laminated on the inner layer 18.

The layer 18a may thus initially be provided having a conductive foil disposed thereon. A post print and etch process may then be performed on the copper foil.

Simultaneously with the coated conductive foil layer 17 being applied over the first surface 18a of the substrate 18 a like coated conductive layer (not shown) may also be applied to the second surface 18b of the substrate 18 to thus create a sandwich. Such a process may be accomplished using conventional equipment.

If the substrate 18 were provided as a coated conductive layer 17' for example then bonding may be done by simultaneously feeding the two coated conductive layers 17, 17' between two stainless steel plates and then processing the printed circuit 10 board in a conventional lamination press. Thus, this invention may be practiced using conventional lamination apparatus.

The adhesive layers 14, 16 may be provided as an epoxy type material. More particularly a tetrafunctional epoxy resin system may preferably be used. For example an epoxy identified as part number FR406 manufactured by Norplex Oak, Inc. Wisconsin may be used. Those of ordinary skill in the art will recognize of course that other resin systems may also be used. For example, dyfunctional, tetrafunctional, bismaleimide/triazine (BT), cyanide esser, or polyimide resin systems may be used.

The prior art approach of providing such a flexible or rigid-flex printed circuit board was expensive because the conductive layer and dielectric/adhesive layer were handled separately. Thus multiple piece parts were handled. This resulted in requiring a large amount of intense direct labor to package, drill, lay-up, each of the separate layers. Thus, this was a significant factor in the cost of manufacturing such printed circuit boards (pcb).

With the present invention, however, each of the layers are bonded together to provide a single piece of material. Thus the number of individual pieces which must be handled is minimized.

The printer circuit board 10 may correspond to a flexible or a rigid-flex pcb.

Figure 2:
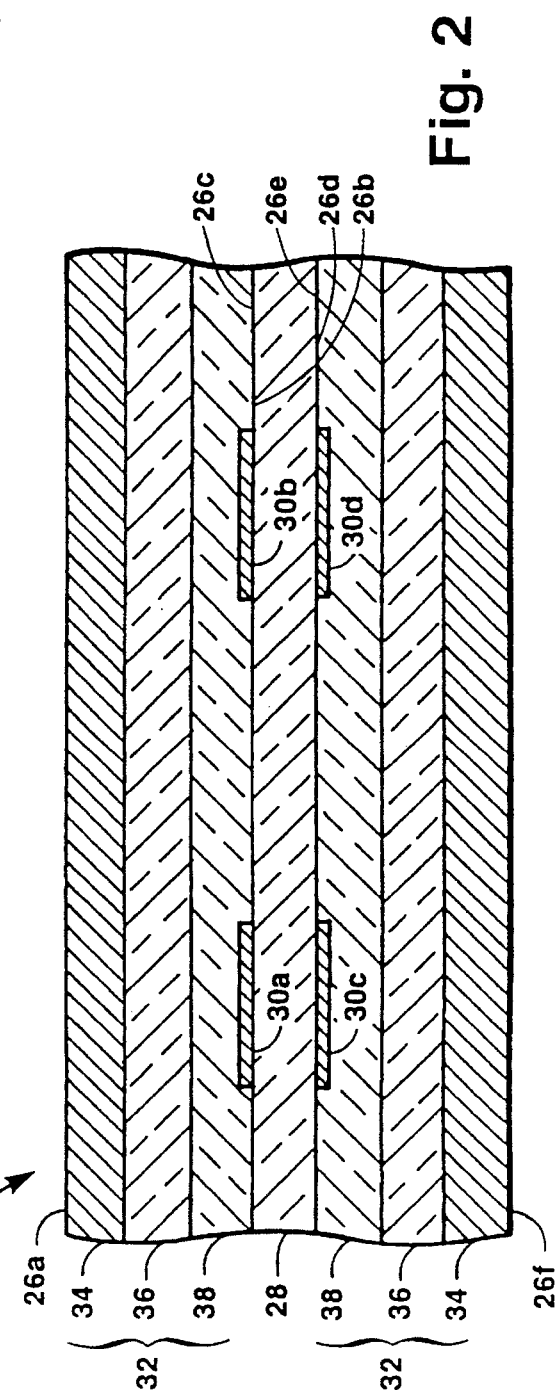
FIG. 2 is a cross-sectional view of a flex printed circuit board having an inner layer.

Referring now to FIG. 2 a printed circuit board 26 includes a substrate 28 having conductive foil regions 30a–30d, generally denoted 30, disposed over first and second surfaces thereof. such conductors 30 need only be disposed where required. Thus in some instances the substrate 28 may be provided having surfaces which are free of conductive plating. That is, the substrate 28 may be provided having unplated surfaces or alternatively one or both inner layer surfaces may have a conductive plating disposed thereon.

The substrate 28 is disposed between a pair of coated conductive foil layers 32, which may be similar to the coated conductive foil layer 17 described above in conjunction with FIG. 1. Each of the conductive foil layers 32 includes a conductive foil 34, a cured adhesive layer 36 and a semicured adhesive layer 38. Thus, the printed circuit board 26 may be used in a mass lamination process.

The substrates 28, 32 are here disposed to provide the printed circuit board 26 as a six layer printed circuit board 26 having a first outer layer 26a, a first inner layer 26b, a second inner layer 26c a third inner layer 26d, a fourth inner layer 26e and a second outer layer 26f.

The inner layers 26c, 26d are here provided having the conductors 30a–30d disposed thereon. As is generally known, such a conductors may be provided, for example, as copper foil having a thickness typically in the range of about 0.0007 inches to 0.0042 inches. Those of skill in the art will recognize that the printed circuit board 26 corresponds to a so-called Type 3 printed circuit board as defined in MIL-P-50884.

The coated conductive foil layers 32 each include a conductive foil 34 which may be provided, for example, from a coated roll of electrodeposited or rolled annealed copper or other conductive metal. The conductive foil 34 is provided having an adhesive 36 coated on a first surface thereof. The adhesive 36 is cured and then a second adhesive 38 is disposed over the cured adhesive 36. The second adhesive 36 is then semi-cured. The first and second adhesives 36, 38 operate as a combined adhesive and dielectric material. Thus, each of the coated conductive foil layers 32 includes conductive foil having a combined adhesive and dielectric disposed thereon.

The coated conductive foil layers 32 may then be simultaneously applied to the first and second opposing surfaces of the substrate 28. The combined adhesive and dielectric material controls the dielectric thickness between the conductive foils and also controls the surface topography. Thus, the surface topography of the printed circuit board 26 is suitable for machine processes and other post bonding processes.

The printed circuit board 26 is thus provided as a homogenous epoxy or polyimide adhesive system that maintains its modules of flexibility after curing. Also by separately curing the first and second adhesive coatings 36, 38 the dielectric distance between layers may be controlled. By providing the adhesive layers 36, 38 from a homogenous dielectric and bonding resin, the printed circuit board 26 is provided having a homogeneous dielectric constant and coefficient of thermal expansion. Furthermore, by providing the second adhesive layer 38 with a high flow resin displacement characteristic, the areas around conductors 30 disposed on the inner layers 26c, 26d may be effectively filled.

Moreover because the dielectric distance between layers may be controlled, the printed circuit board 26 may be provided having a smooth surface. Thus, because of the even surface topography, a plurality of such boards may be stacked and simultaneously drilled or processed through other machining processes.

Also by providing the cured and uncured adhesive layers 36, 36 it is possible to effectively control line impedance characteristics based on the pre-cured desired thickness. The current tolerance of electrical impedance variation is reduced by over fifty percent.

Figure 3:
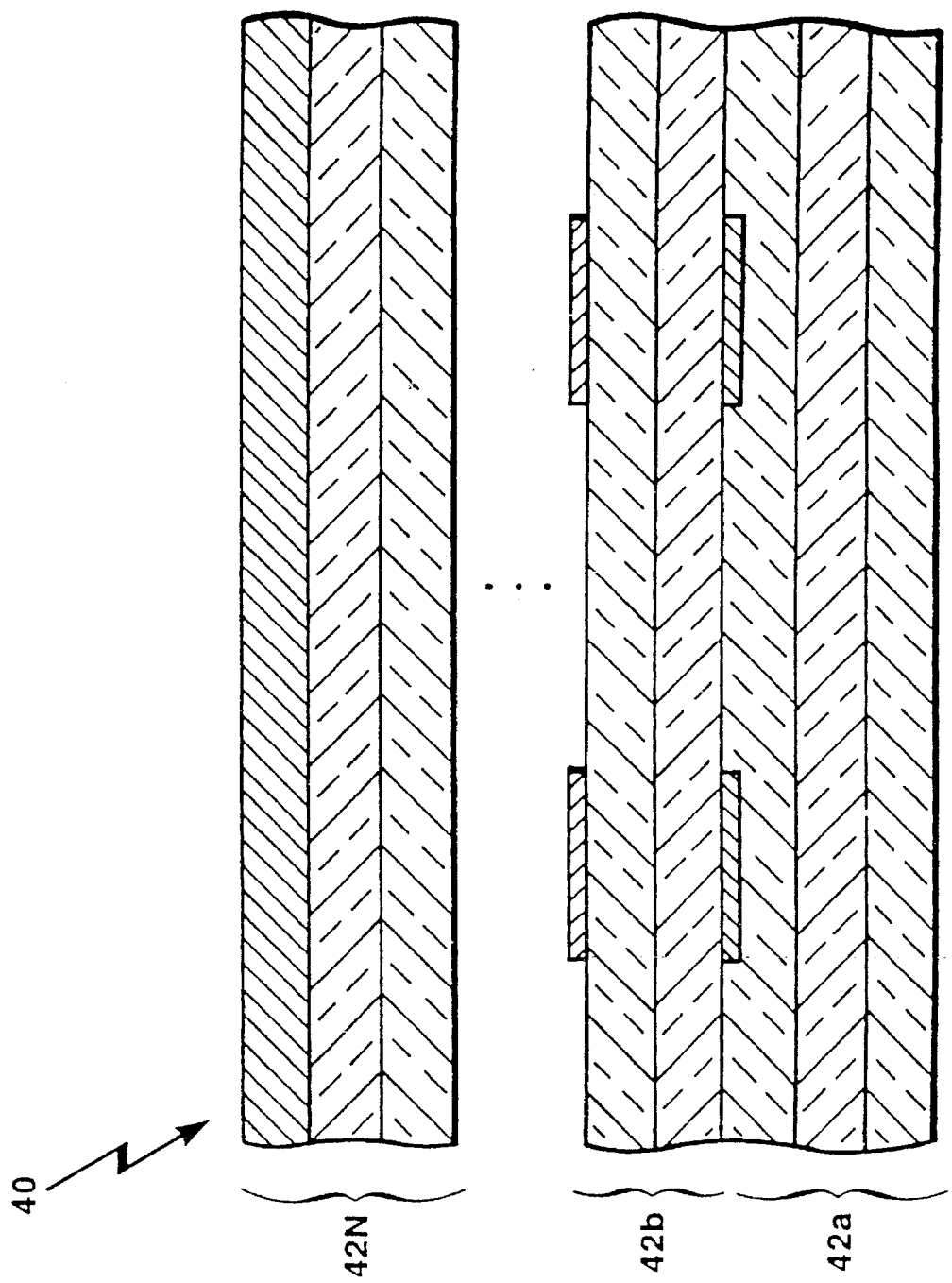
FIG. 3 is a cross-sectional view of a printed circuit board having a plurality of layers.

Referring now to FIG. 3 a printed circuit board 40 includes a plurality of substrates 42a–42N, generally denoted 42. The substrates 42 are here disposed to provide the printed circuit board 40. Each of the substrates 42 correspond to coated conducted foil layers which may be provided using the same techniques as the coated conductive foil layers 17 and 32 described above in conjunction with FIGS. 1 and 2. Here, each of the N substrates 42 may be simultaneously bonded together using conventional techniques to provided the printed circuit board 40. Since the circuit 40 will be provided having even surface topographies, all machining steps such as drilling and the like may be simultaneously performed on the flat stack of N bonded substrates.

Figure 4:
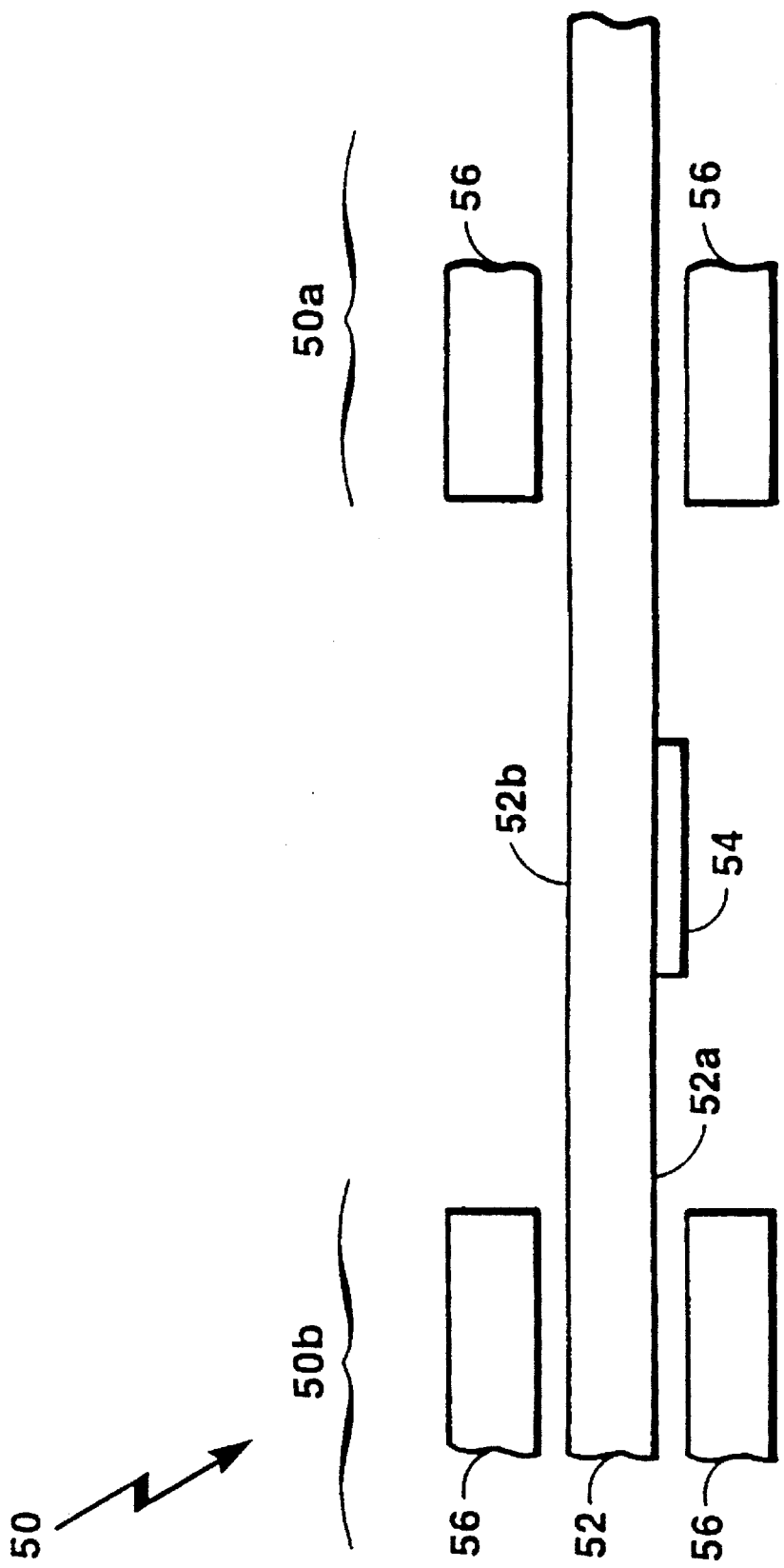
FIG. 4 is a cross-sectional view of a rigid-flex printed circuit board.

Referring now to FIG. 4, a so-called Type 4 rigid-flex printed circuit board 50 includes a flex portion 50a and a rigid portion 50b. The characteristics of a Type 4 printed circuit boards are well known to those of skill in the art and are set forth in MIL-P50884.

The printed circuit board 50 includes an inner layer 52 having first and second opposing surfaces 52a, 52b. Here the surface 52a has a conductive plating 54 disposed thereon. Those of skill in the art will recognize of course that the layer 52 may or may not have a conductive plating disposed thereon. That is, the layer 52 may be provided having unplated surfaces or alternatively one or both inner layer surfaces 52a, 52b may have a conductive plating disposed thereon. The inner layer 52 is disposed between a pair of coated conductive foil layers 56. Thus, the printed circuit board may be used in a mass lamination process.

The coated conductive foil layers 56 may each be provided in a manner similar to the coated conductive foil layers 17, 32 and 42 described in conjunction with FIGS. 1–3 above. The printed circuit board 50 is thus provided as a homogenous epoxy or polyimide adhesive system that maintains its modules of flexibility after curing and is provided having an even surface topography. Thus, a rigid-flex printed circuit board having three or more layers may be provided having an even surface topography.

By using the coated conductive foil layers 56 the multiple layer rigid-flex printed circuit board 50 may be provided having a homogeneous construction and without the use of any woven materials. That is, with the present invention no glass or any other woven materials are used in the rigid-flex printed circuit board. Thus, both the inner and outer layers of the rigid-flex printed circuit board 50 are provided from non-woven materials.

That is, the multi-layer rigid-flex printed circuit board having a homogeneous construction is provided from non-woven inner layers and non-woven bonding materials such as straight epoxy. Thus, in the present invention, a multi-layer rigid-flex printed circuit board is provided without the use of pre-impregnated glass cloth or other woven materials.

The Type 4 rigid-flex printed circuit board 50 may thus be provided from a combination of resins and materials which eliminate the use of woven materials such as glass fabric as coating mediums as well as an insulators. This allows each of the layers of the printed circuit board 50 to thermally dissipate heat in any linear radial direction about the thermal source.

In conventional printed circuit boards, the thermal paths are substantially confined to paths which lie in the traditional machine and transverse directions of the woven material, as is known for example, with 104 to 7628 glass fabric that has been coated into so-called prepreg material. Thus, rather than using woven materials, non-woven highly thermally stabile materials such as aramid thin core inner layers coated with the same resin system may be used to provide a printed circuit board having homogenous nonwoven layers.

The printed circuit board 50 of the present invention is therefore provided having a thermal stability which is more uniform than heretofore and consequently such printed circuit boards suffer a reduced number of defects due to measeling for example. Moreover, by eliminating the glass and other woven fabric, the printed circuit board 50 may be provided as a relatively thin printed circuit board.

Having described preferred embodiments of the invention, it will now become apparent to one of skill in the art that other embodiments incorporating the concepts may be used. It is felt, therefore, that these embodiments should not be limited to disclosed embodiments but rather should be limited only by the spirit and scope of the appended claims.

What is claimed is:

1. A method of manufacturing a printed circuit board comprising the steps of:

coating a first surface of a first conductive foil with a first adhesive;

curing the first adhesive on the first surface of the first conductive foil;

coating a first surface of the cured first adhesive with a second adhesive;

semi-curing the second adhesive on the first surface of the cured first adhesive; and applying the semi-cured second adhesive against a first surface of a substrate, so as to form a printed circuit board.

2. The method of claim 1 further comprising the steps of:

coating a first surface of a second conductive foil with a third adhesive;

curing the third adhesive on the first surface of the second conductive foil;

coating a first surface of the cured third adhesive with a fourth adhesive;

semi-curing the fourth adhesive on the first surface of the cured third adhesive; and applying the semi-cured fourth adhesive against a second surface of the substrate.

3. The method of claim 2 wherein the substrate has a conductor disposed on at least one of the first and second surfaces of the substrate and wherein the corresponding semi-cured adhesive fills in spaces around the conductor on the substrate.

4. The method of claim 3 wherein the semi-cured adhesive layers associated with the first and second conductive foils are simultaneously applied to the corresponding first and second surfaces of the substrate, respectively.

5. The method of claim 4 wherein the semi-cured adhesive layers associated with the first and second conductive foils are simultaneously cured against the corresponding first and second surfaces of the substrate, respectively.

6. A method of manufacturing a layer of a printed circuit board comprising the steps of:

coating a first surface of a conductive foil with a first adhesive;

curing the first adhesive on the first surface of the conductive foil;

coating a first surface of the cured first adhesive with a second adhesive; and semi-curing the second adhesive on the first surface of the cured first adhesive, so as to form a layer of a printed circuit board.

* * * * *